(12) United States Patent
Iguchi et al.

(10) Patent No.: US 6,815,708 B1
(45) Date of Patent: Nov. 9, 2004

(54) OPTICAL SUPERCONDUCTING DEVICE

(75) Inventors: Ienari Iguchi, Ibaraki (JP); Eiji Kume, Tokyo (JP)

(73) Assignee: Japan Science and Technology Agency, Kawaguchi (JP)

( * ) Notice: Subject to any disclaimer, the term of this patent is extended or adjusted under 35 U.S.C. 154(b) by 232 days.

(21) Appl. No.: 10/048,481

(22) PCT Filed: Aug. 9, 2000

(86) PCT No.: PCT/JP00/05328

§ 371 (c)(1),
(2), (4) Date: Feb. 8, 2002

(87) PCT Pub. No.: WO01/13439

PCT Pub. Date: Feb. 22, 2001

(30) Foreign Application Priority Data

Aug. 16, 1999 (JP) ............................................ 11-230087

(51) Int. Cl.[7] ............................................. H01L 39/22
(52) U.S. Cl. ............................. 257/33; 257/31; 257/84; 250/336.2; 505/190
(58) Field of Search ........................... 257/33, 31, 84; 505/190; 250/336.2; 365/190

(56) References Cited

U.S. PATENT DOCUMENTS 5,039,951 A * 8/1991 Cheung et al. ............. 329/302
6,348,699 B1 * 2/2002 Zehe .......................... 257/32

FOREIGN PATENT DOCUMENTS

| JP | 1-302782 | 12/1989 |
| JP | 5-121910 | 5/1993 |
| JP | 9-6463 | 3/1997 |
| JP | 11-274585 | 10/1999 |

* cited by examiner

Primary Examiner—Jerome Jackson
(74) Attorney, Agent, or Firm—Westerman, Hattori, Daniels & Adrian, LLP

(57) ABSTRACT

An optic superconducting circuit element (10) is disclosed that is operable to transmit and receive on an identical chip an electromagnetic wave having frequencies in an extended frequency band ranging from microwave to THz frequency bands and with high sensitivity. The optic superconducting circuit element (10) includes the chip (3), and a superconducting electromagnetic wave oscillating (generating and transmitting) source (16) and a superconducting Josephson junction device (14) disposed in close vicinity to each other on the chip (3), the superconducting Josephson junction device (14) detecting the electromagnetic wave transmitted from the superconducting electromagnetic wave oscillating (generating and transmitting) source (16). The optic superconducting circuit element (10) operates in a manner such that the superconducting electromagnetic wave oscillating (generating and transmitting) source (16) is biased at a fixed electric current to generate an electromagnetic wave, and the superconducting Josephson junction device (14) is biased at a fixed current whereupon the point of biasing is successively shifted in response to a change according to the presence or absence of the electromagnetic wave to derive continuous spectral information thereof.

4 Claims, 4 Drawing Sheets

OPTICAL SUPERCONDUCTING DEVICE

TECHNICAL FIELD

The present invention relates to an optic superconducting circuit element that is useful in the field of superconducting micro-optoelectronics, which provided with both superconducting Josephson electromagnetic wave oscillating (generating and transmitting) and receiving junctions is capable of acting to oscillate (transmit) and to receive an electromagnetic wave having a frequency in a THz frequency band.

BACKGROUND ART

So far, ac Josephson (alternating current) effect detecting device has been known as a superconducting, electromagnetic wave detecting apparatus.

As far as the detection of an electromagnetic wave is concerned, B. D. Josephson has made a proposition (see Physics Letters, Vol. 1, 251–253, 1962) that biasing a superconducting junction at a finite voltage draws an extra-high frequency alternating current through the superconducting junction, but the irradiation of an electromagnetic wave on the superconducting junction from its outside causes these electromagnetic waves to be mixed together and a current step to appear at a voltage corresponding to a beat caused by two slightly different frequencies of those waves, from which current step the input electromagnetic wave can be detected. The Josephson's proposition, which relates only to the principles of detection, makes no mention of any detailed method of such detection, however.

S. Shapiro et al conducted a test designed to verify the principles of detection proposed by Josephson through the use of an Al/AlOx/Sn junction and first observed such a current step, which was induced by the irradiation with a single-frequency microwave. They made no mention, however, of any high sensitivity technique that may be used to detect a spectrum over a terahertz (THz) frequency range. See Review of Modern Physics, Vol. 36, 223–225, 1964.

In an attempt to detect electromagnetic waves over a wide infrared frequency range by using a Josephson junction, Grimes et al have biased the Josephson junction at a fixed current, irradiated the junction with such an electromagnetic wave turned on and off alternately, and measured a difference in potential across the junction as an electromagnetic wave response. See Journal of Applied Physics, Vol. 39, 3905–3912, 1968.

In this method of measurement, not only does the use for the Josephson detector of a low temperature superconductor that is small in its energy gap make it difficult to measure an electromagnetic wave in a THZ frequency range, but also its oscillating (generating and transmitting) source located remote from the detector makes it hard to detect the oscillating (generating and transmitting) source of the electromagnetic wave if weak in its intensity.

Kanter, Vernon et al have used a point contact Josephson junction made of Nb to detect broadband electromagnetic waves in the neighborhood of 90 GHz. See Journal of Applied Physics, Vol. 43, 3174–3183, 1972. In this method of detection, too, the source of oscillation (transmission) of the electromagnetic waves and their detector not of an on-chip construction but located remote from each other and the use of a low temperature Nb superconductor to form the Josephson junction for detection makes it hard to detect electromagnetic waves over a broad THz frequency band.

Further, Divin et al have conducted a theoretical analysis and basic experimentation in order to apply the Josephson AC effect to the spectrum detection of incoherent broadband electromagnetic waves (see IEEE Transactions on Magnetics, Vol. MAG-19, 613–615, 1983) and, on obtaining apposite results confirming the agreement of the theory with the experiments, built up of the foundation of the detection of broadband electromagnetic waves by the use of the Josephson junction.

In the experimentation, it was successful to detect electromagnetic waves in the neighborhood of 600 GHz by using the junction that was of a Nb point contact type. Here again, the use of Nb as a low temperature superconductor that is smaller in energy gap than a high temperature superconductor makes it difficult to detect electromagnetic waves largely broadened over a THz frequency band. Yet further, no mention is made at all in the report of a concept to improve the sensitivity of detection by adopting an on-chip construction.

Thus, while there have been precedents in which the principles of detecting and the method of measuring broadband electromagnetic waves by the use of a Josephson junction are applied to an electromagnetic wave detector, there has not yet been made extant any optic superconducting circuit element operable to oscillate (transmit) and receive an electromagnetic wave over an extended frequency band ranging from microwave to THz frequency bands.

With the foregoing taken into account, it is accordingly an object of the present invention to provide an optic superconducting circuit element that is highly sensitive and operable to oscillate (transmit) and receive broadband electromagnetic wave of frequencies ranging from a microwave to a THz ranges.

DISCLOSURE OF THE INVENTION

In order to achieve the object mentioned above, there is provided in accordance with the present invention an optic superconducting circuit element that comprises a superconducting electromagnetic wave oscillating (generating and transmitting) source for oscillating (generating and transmitting) an electromagnetic wave and a superconducting Josephson junction device for receiving the electromagnetic wave transmitted from the said superconducting electromagnetic wave oscillating (generating and transmitting) source, and wherein the said superconducting electromagnetic wave oscillating (generating and transmitting) source and the said superconducting Josephson junction device are mounted on a single chip.

Preferably, the said superconducting electromagnetic wave oscillating (generating and transmitting) source and the said superconducting Josephson junction device are so mounted as spaced from each other at a distance not greater than 1 mm.

Preferably, the said superconducting Josephson junction device has a (Josephson) junction adapted to receive the said electromagnetic wave transmitted from the said superconducting electromagnetic wave oscillating (generating and transmitting) source, and the circuit element further comprises a means for detecting the said electromagnetic wave in response to ac Josephson (alternating current) effect brought about at the said junction by the said electromagnetic wave incident thereon.

The optic superconducting circuit element according to the present invention preferably further includes a means for biasing the said superconducting Josephson junction device with a fixed electric current and shifting the point of such biasing successively in response to a change occurring according to the presence or absence of the electromagnetic wave, thereby providing continuous spectral information thereof.

The said electromagnetic wave may have frequencies in a frequency band ranging from microwave to THz frequency bands.

Also, in the optic superconducting circuit element according to the present invention, each of the said superconducting electromagnetic wave oscillating (generating and transmitting) source and the said superconducting Josephson junction device is made preferably of a superconductor that is large in superconducting energy gap to extend the detectable frequency band of the electromagnetic wave to cover a THz frequency band. The said superconductor is advantageously a high temperature oxide superconductor.

Further, in the optic superconducting circuit element according to the present invention, each of the said superconducting electromagnetic wave oscillating (generating and transmitting) source and the said superconducting Josephson junction device is formed of a thin film, or a thin film, single crystal film superconductor.

In an optic superconducting circuit element constructed as mentioned above, an electromagnetic wave made incident onto the Josephson junction biased at a fixed voltage is mixed with a high frequency electric current brought about by ac Josephson effect to cause it to appear as a change in its DC component. If the input power signal is sufficiently small, its change has a zero-order change thereof primarily contributing thereto.

Detection by ac Josephson effect satisfies the conditions prescribed by the relationship between the Josephson voltage and the frequency. Accordingly, if the input electromagnetic wave has a narrow frequency band, sharp responses appear at voltages corresponding to its frequencies. If, however, the input electromagnetic wave is weak and has a broad frequency band, then there does it appear as a continuous spectrum over a wide voltage range.

The present invention in which a superconducting electromagnetic wave oscillating (generating and transmitting) source is provided on a same chip on which is provided a superconducting Josephson junction device as a detector for an electromagnetic wave from the source and moreover in which the distance between the oscillating (transmitting) source and the electromagnetic wave detector can be set, e.g., within the order of 1 mm, makes it possible to receive according to the Josephson junction detection principle a weak or feeble power signal in a broad frequency band and with high sensitivity.

The frequencies detectable here are determined by the energy gap of a high temperature superconductor used for the detector and in principle extend even to the order of 10 THz.

The present invention, thus by joining a high sensitivity superconducting electromagnetic wave detector and an oscillating (a transmitting) source together in close proximity, makes it possible to realize an optic superconducting circuit element capable of performing a high sensitivity, broad band signal oscillation (transmission) and reception that has never been attainable heretofore.

BRIEF DESCRIPTION OF THE DRAWINGS

The present invention will better be understood from the following detailed description and the drawings attached hereto showing certain illustrative forms of embodiment of the present invention. In this connection, it should be noted that such forms of embodiment illustrated in the accompanying drawings hereof are intended in no way to limit the present invention but to facilitate an explanation and understanding thereof.

In the drawings.

BEST MODES FOR CARRYING OUT THE INVENTION

Figure 1:
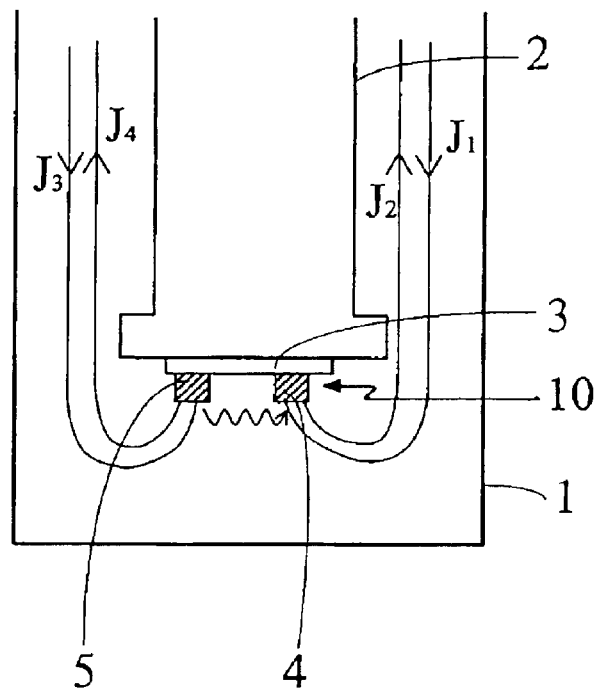
FIG. 1 is a diagrammatic view of apparatus construction, illustrating an optic superconducting circuit element according to the present invention in which for its cooling means use is made of a refrigerator (cryocooler)

A detailed explanation is now given below in respect of an optic superconducting circuit element according to the present invention as a preferred form of embodiment thereof with reference to the drawing figures. For the purposes of the following description it should be noted that in the Figures the same reference characters are used to indicate the substantially identical or corresponding members.

Figure 2:
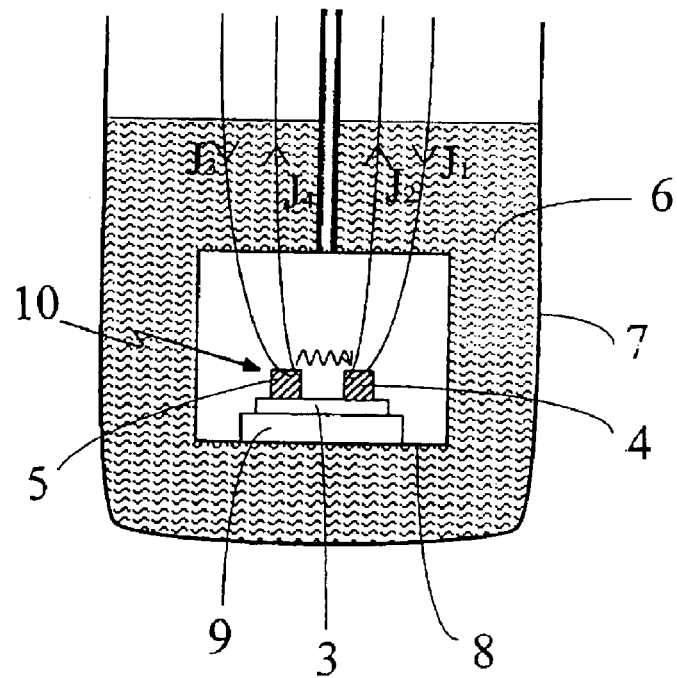
FIG. 2 is a diagrammatic view of apparatus construction, illustrating an optic superconducting circuit element according to the present invention in which for its cooling means use is made of liquid helium as a refrigerant (freezing medium)

FIG. 1 is a diagrammatic view of apparatus construction, illustrating an optic superconducting circuit element according to the present invention in which for its cooling means use is made of a refrigerator (cryocooler), and FIG. 2 is a diagrammatic view of apparatus construction, illustrating an optic superconducting circuit element according to the present invention in which for its cooling means use is made of liquid helium as a refrigerant (freezing medium).

Referring to FIG. 1, the optic superconducting circuit element of this invention, indicated by reference character 10, is shown disposed in good thermal contact with a cold head 2 of the refrigerator that is in turn disposed within a chamber 1 to serve as the cooling means for cooling a superconductor to a temperature below its transition temperature Tc, the chamber 1 being evacuatable to a vacuum.

The optic superconducting circuit element 10 includes a chip 3 and either a superconducting electromagnetic wave oscillating (generating and transmitting) source 5 constituted of a thin film superconductor fabricated on the chip 3 or a superconducting electromagnetic wave oscillating (generating and transmitting) source 5 constituted of a thin film single crystal film superconductor fabricated on the chip 3. Included also in the optic superconducting circuit element 10 is a superconducting Josephson junction device 4 constituted of a high temperature oxide superconductor disposed in close vicinity to the superconducting electromagnetic wave oscillating (generating and transmitting) source 5 on the chip 3 for detecting an electromagnetic wave from the superconducting electromagnetic wave oscillating (generating and transmitting) source 5. Here, the superconducting electromagnetic wave oscillating (generating and transmitting) source 5 and the superconducting Josephson junction device 4 are designed to be supplied with electric currents separately from each other from their respective constant current bias sources (not shown).

If use is made of liquid helium for the cooling means, the optic superconducting circuit element 10 according to the present invention is disposed within a sample chamber 8 of a cooling apparatus 7 filled with liquid helium 6 as a cooling means for cooling the superconductor to a temperature below its transition temperature Tc and is mounted on a copper block 9 held in good thermal contact with the liquid helium.

Mention is next made of details of an optic superconducting circuit element of the present invention.

Figure 3:
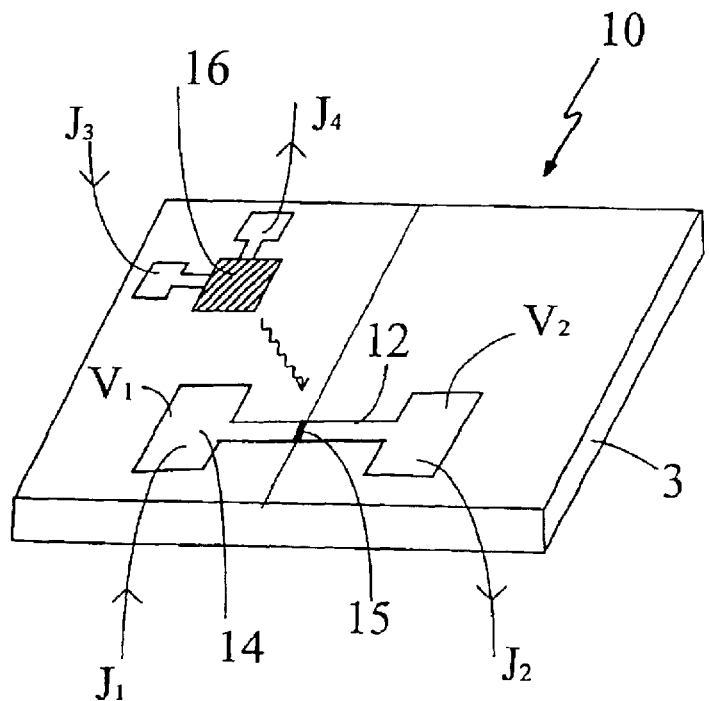
FIG. 3 is a diagrammatic view of appearance of an optic superconducting circuit element according to the present invention in which a superconducting electromagnetic wave oscillating (generating and transmitting) source is fabricated on a chip by using a thin film of a superconductor formed thereon.
Figure 4:
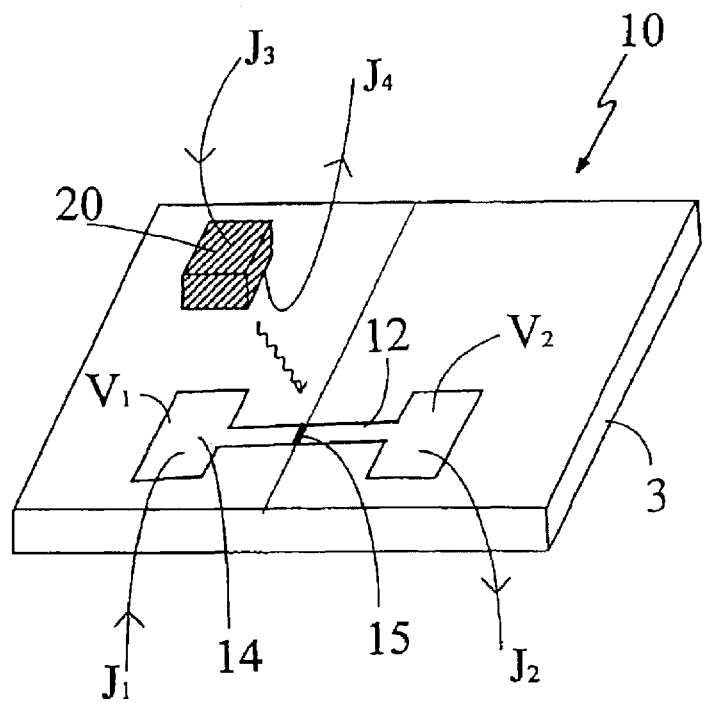
FIG. 4 is a diagrammatic view of appearance of an optic superconducting circuit element according to the present invention in which a superconducting electromagnetic wave oscillating (generating and transmitting) source is fabricated on a chip by using a thin film, single crystal film superconductor formed thereon.

FIG. 3 is a diagrammatic view of appearance of an optic superconducting circuit element according to the present invention in which a superconducting electromagnetic wave oscillating (generating and transmitting) source 16 and a superconducting Josephson junction devices 14 are fabricated on a chip 3 by using a thin film of a superconductor formed thereon and a high temperature oxide superconductor formed also thereon. FIG. 4 is a diagrammatic view of appearance of an optic superconducting circuit element according to the present invention in which a superconducting electromagnetic wave oscillating (generating and transmitting) source 20 and a superconducting Josephson junction devices 14 are fabricated on a chip 3 by using a thin film, single crystal film of a superconductor formed thereon and a high temperature oxide superconductor formed also thereon. It should be noted here that the chip 3 is shown as taken out for one unit of the optic superconducting circuit element fabricated on a crystalline substrate.

Referring to FIGS. 3 and 4, the optic superconducting circuit element 10 is shown comprising the chip 3 for which use is made of a bi-crystalline substrate prepared by joining together a pair of single crystalline substrates crystallographically oriented at mutually different angles, either the superconducting electromagnetic wave oscillating (generating and transmitting) source 16 for which use is made of a thin film of superconductor formed on the chip 3 or the superconducting electromagnetic wave oscillating (generating and transmitting) source 20 for which use is made of a thin single crystal film of superconductor formed on the chip 3, and the superconducting Josephson junction device 14 for detecting electromagnetic waves, the device 14 having a constriction or necking 12 in its central area and formed with a Josephson junction 15 and for which use is made of a high temperature oxide superconductor. The superconducting Josephson junction device 14 is prepared by causing a thin film of high temperature oxide superconductor to grow on the bi-crystalline substrate from the substrates joined together and is then formed thereon naturally. If use is made of an ordinary single crystal substrate in lieu of the bi-crystalline substrate, then a Josephson junction to be formed is of layered thin-film type.

The distance between the superconducting electromagnetic wave oscillating (generating and transmitting) source 16 and the superconducting Josephson junction device 14 although depending on the frequency bands of electromagnetic waves should desirably be generally within 1 mm or so, considering high sensitivity reception of a weak signal and so forth. This equally applies to the superconducting electromagnetic wave oscillating (generating and transmitting) source 20 using a thin film of single crystal superconductor.

The superconducting electromagnetic wave oscillating (generating and transmitting) source 16 is formed, for example, by joining an Au metal electrode and an $YBa_2Cu_3O_{7-y}$ high temperature oxide superconductor with a dielectric barrier layer to form a tunnel junction. The superconducting Josephson junction device 14 for use in detecting an electromagnetic wave is made of a superconductor that is preferably large in superconducting energy gap. Use should be made of, for example, an $YBa_2Cu_3O_{7-y}$ high temperature oxide superconductor. While a low temperature superconductor has an energy gap as small as several meV, a high temperature oxide superconductor has an energy gap as large as several tens meV, one order greater than that.

It should be noted here that while a superconductor realizes a separated energy state, i.e., it is lower in energy state than a normal conductor, a difference in energy between them on electronic level is called "superconducting energy gap".

The superconductor material here is preferably $La_{2-x}Sr_xCuO_4$, $Bi_2Sr_2CaCu_2O_y$ whose transition temperature is 80 K (hereafter referred to as "BSCCO"), $Bi_2Sr_2Ca_2Cu_3O_y$ whose transition temperature is 110 K, or $YBa_2Cu_3O_{7-y}$ whose transition temperature is 80 to 90 K (hereafter referred to as "YBCO"), although any other high temperature oxide superconductor can be utilized insofar as it is satisfactory in crystallinity.

YBCOs include a superconductor in which a transition element is replaced for Y, such as, for example, $ErBa_2Cu_3O_{7-y}$ and $NdBa_2Cu_3O_{7-y}$. As far as high temperature superconductors are concerned whose transition temperatures are higher than the temperature of liquid nitrogen, it is possible to use liquid nitrogen in place of liquid helium. Note also that in the chemical equations above, the suffixes x and y include 0 (zero).

Mention is next made of the operation of an optic superconducting circuit element according to the present invention.

As shown in FIG. 3, the superconducting electromagnetic wave oscillating (generating and transmitting) source 16 using a thin film of superconductor is supplied via J3 and J4 with electric currents from their respective constant current sources (not shown) to oscillate (generate and transmit) an electromagnetic wave. The electromagnetic wave is made incident onto the superconducting Josephson junction device 14 made of a high temperature oxide superconductor supplied via J1 and J2 with electric currents from their respective constant current sources. The electromagnetic wave made incident onto the Josephson junction 15 biased at a constant voltage is coupled to a high frequency electric current brought about by ac Josephson effect to cause it to appear as a change in its DC current component. If the input power signal is sufficiently small, its change has a zero-order change thereof primarily contributing thereto. Such a change in the DC component can be detected as a change in voltage according to the presence of irradiation of the Josephson junction 15 with an electromagnetic wave, thereby permitting the optic superconducting circuit element 10 to operate by oscillating (generating and transmitting) and receiving the electromagnetic wave.

In the optic superconducting circuit element shown in FIG. 4 as well, the superconducting electromagnetic wave source 20 using a thin single crystal film of superconductor is supplied via J3 and J4 with electric currents from their respective constant current sources (not shown) to oscillate (generate and transmit) an electromagnetic wave. Here again, the electro-magnetic wave is made incident onto the superconducting Josephson junction device 14 made of a high temperature oxide superconductor supplied via J1 and J2 with electric currents from their respective constant current sources. Operating in the same manner as mentioned above, the optic superconducting circuit element 10 oscillates (generates and transmits) and receives the electromagnetic wave.

Thus, an optic superconducting circuit element having a superconducting electromagnetic wave oscillating (generating and transmitting) source 16 or 20 and a superconducting Josephson device 14 disposed and spaced from each other by a distance of about 1 mm or less on a single chip and in which for each of the superconducting electromagnetic wave oscillating (generating and transmitting) source 16, 20 and a superconducting Josephson device 14 use is made of a high temperature oxide superconductor that is large in superconducting energy gap, makes it possible to operate to oscillate (generate and transmit) electromagnetic waves over extended frequency bands ranging from microwave to THz bands and yet with a high sensitivity.

Mention is next made of specific examples of an optic superconducting circuit element according to the present invention.

Figure 5:
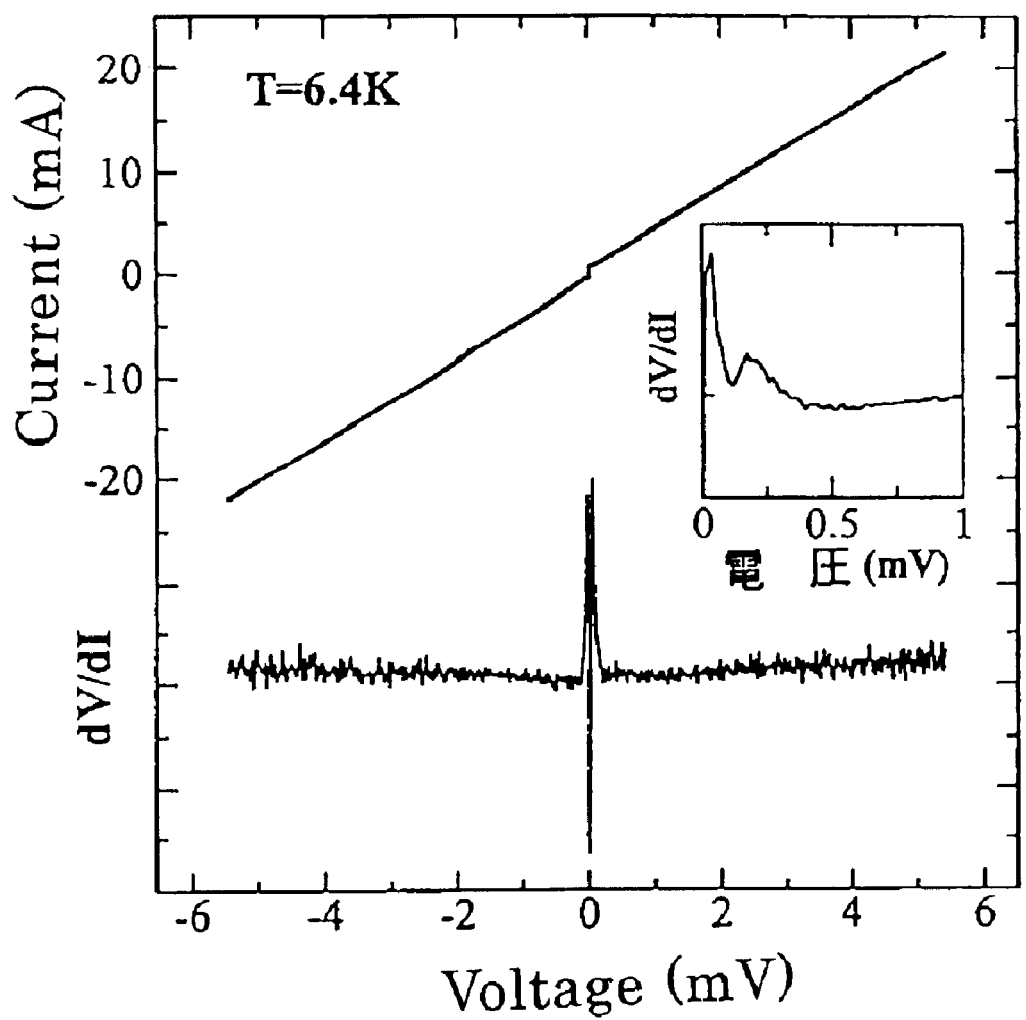
FIG. 5 is a typical graph showing current vs. voltage characteristics and differential resistance characteristics measured of an optic superconducting circuit element formed of a high temperature oxide superconductor according to the present invention.
Figure 6A:
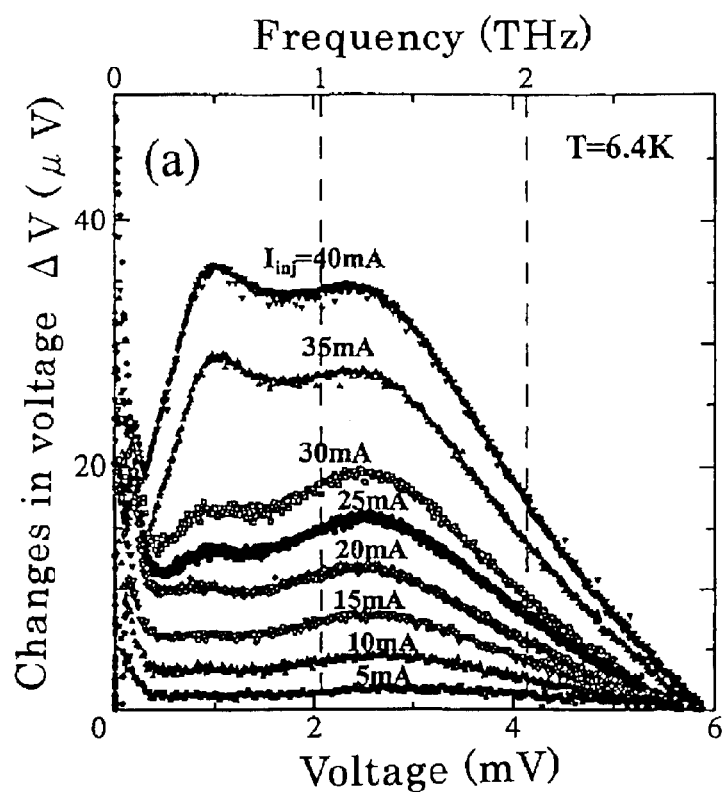
FIG. 6 shows typical graphs showing characteristics measured of an optic superconducting circuit element according to the present invention wherein graph (a) represents measured results at a measurement temperature of 6.4 K and graph (b) represents measured results at a measurement temperature of 20 K.
Figure 6B:
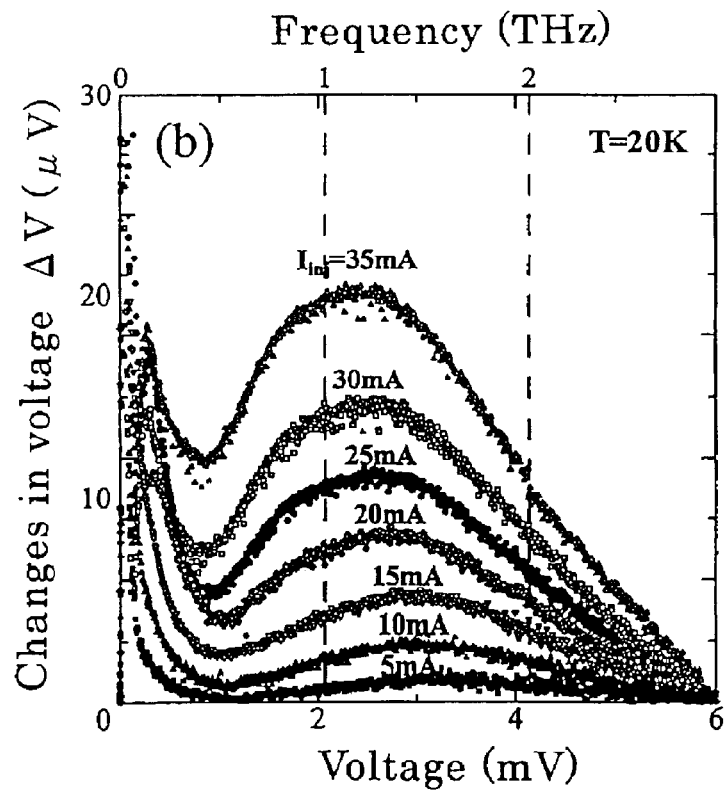

FIG. 5 is a graph showing the current v. voltage characteristic of a superconducting Josephson junction device 14 using an $YBa_2Cu_3O_{7-y}$ superconductor for the thin film of high temperature superconductor 14, including a graph showing a current by a voltage differential characteristic thereof. FIG. 6 shows results of measurement in an example in which a superconducting electromagnetic wave oscillating (generating and transmitting) source 16 using an $YBa_2Cu_3O_{7-y}$ superconductor for the thin film of high temperature superconductor and made of $Au/I/YBa_2Cu_3O_{7-y}$ (where I represents an dielectric barrier layer) is biased with electric currents of various current magnitudes ($I_{inj}$) to oscillate (generate and transmit) an electromagnetic wave in a THz frequency band, which is measured by a superconducting Josephson junction device shown in FIG. 5, located spaced apart therefrom at a distance of 0.7 mm.

In the measurement whose results are shown in FIG. 6, the superconducting electromagnetic wave oscillating (generating and transmitting) source 16 is biased with a fixed current magnitude ($I_{inj}$) to oscillate (generate and transmit) an electromagnetic wave and the voltage (V) applied across the Josephson junction 15 of the superconducting Josephson junction device 14 are varied successively between 0 and 6 mV. Thereupon, by switching on and off the bias current ($I_{inj}$) applied to superconducting electromagnetic wave oscillating (generating and transmitting) source 16 at each of these voltage magnitudes Fn and measuring as changes in voltage ΔV changes in current then passed through the Josephson junction 15, the measurement obtains information as to consecutive spectra of the electromagnetic wave oscillated (generated and transmitted) by the superconducting electromagnetic wave oscillating (generating and transmitting) source 16.

In the graphs in FIG. 6, the ordinate represents changes in voltage ΔV as mentioned above and the abscissa represents the voltage V applied across the Josephson junction 15 as above. Applying a voltage (V) across the Josephson junction 15 brings about ac Josephson effect, which draws through the Josephson junction 15 an alternating current of a frequency f determined by the relationship: 2eV=hf where e is the charge of an electron and h is the Planck's constant. The frequency f is plotted along the abscissa represented at the top of each of the graphs in FIG. 6. While in the embodiments illustrated by the graphs shown in FIG. 6 the frequencies of which electromagnetic waves are detectable are shown having a higher level of 2 THz, it should be noted that refining the conditions for preparing thin films of the identical superconductor material is found to allow those of higher frequencies to be detectable, i.e., up to about 10 THz with a junction biasing voltage of 20 mV. To wit, it is anticipated that optimizing the conditions for preparing thin superconductor films, including a choice among superconductor materials, should make it possible to further broaden the frequencies detectable.

Industrial Applicability

As will be appreciated from the foregoing description, the present invention provides an optic superconducting circuit element that incorporates on a single chip superconducting electromagnetic wave oscillating (generating and transmitting) 4 and receiving Josephson junctions, thereby making it possible to accomplish operations for both oscillating (generating and a transmitting) and receiving electromagnetic waves in an extended frequency band, ranging from microwave to THz frequency bands and with high sensitivity. Hence, it should be highly useful in the field of superconducting micro-optoelectronics.

What is claimed is:

1. An optic superconductor circuit element, comprising:
   a chip having a superconducting electromagnetic wave oscillating (generating and transmitting) source and a superconducting Josephson junction device mounted thereon, said superconducting electromagnetic wave oscillating (generating and transmitting) source generating and transmitting an electromagnetic wave in a broad frequency band extending over microwave to THz frequency bands, said superconducting Josephson device being adapted to have the electromagnetic wave incident thereon and to have a DC (direct current) voltage applied thereto;
   a means for shifting said DC voltage from one magnitude to another successively; and
   a means for detecting a change in direct current passed through said superconducting Josephson device when each of such shifted magnitudes of said voltage is applied there across which change in current represents the presence or absence of a particular frequency component of the electromagnetic wave corresponding to each such voltage magnitude, thereby permitting information to be transmitted and received between said superconducting electromagnetic wave oscillating (generating and transmitting) source and said superconducting Josephson junction device by means of frequencies in a broad frequency band extending over microwave to THz frequency bands.

2. An optic superconducting circuit element as set forth in claim 1, wherein said particular frequency corresponding to each such voltage magnitude is determined from relationship: $2 \times e \times V = h \times f$ where V represents the DC voltage magnitude, f represents the frequency, C represents the charge of an electron and b represents the Planck's constant.

3. An optic superconducting circuit element as set forth in claim 1 wherein said DC voltage is shifted successively from one voltage magnitude of 0 volt to a superconducting gap voltage of said superconductor.

4. An optic superconducting circuit element as set forth in claim 1, wherein each of said superconducting electromagnetic wave oscillating (generating and transmitting) source and said superconducting Josephson junction device are each formed of a thin film, or a thin film single crystal, which is made of a high temperature oxide superconductor.

* * * * *